United States Patent [19]

Kurz et al.

[11] Patent Number: 4,700,075
[45] Date of Patent: Oct. 13, 1987

[54] DETECTOR FOR BACK-SCATTERED ELECTRONS

[75] Inventors: Dieter Kurz, Aalen; Norbert Schäfer, Essingen, both of Fed. Rep. of Germany

[73] Assignee: Carl-Zeiss-Stiftung, Heidenheim, Fed. Rep. of Germany

[21] Appl. No.: 818,248

[22] Filed: Jan. 13, 1986

[30] Foreign Application Priority Data

Jan. 12, 1985 [DE] Fed. Rep. of Germany ....... 3500903

[51] Int. Cl.⁴ .................. G01T 1/20; G01N 23/203
[52] U.S. Cl. .................................. 250/368; 250/310; 250/483.1
[58] Field of Search ............... 250/310, 483.1, 368

[56] References Cited

U.S. PATENT DOCUMENTS

| | | | |
|---|---|---|---|
| 4,177,379 | 12/1979 | Furukawa et al. | 250/310 |
| 4,217,495 | 8/1980 | Robinson | 250/483.1 |
| 4,438,332 | 3/1984 | Lichtenegger | 250/310 |
| 4,560,882 | 12/1985 | Barbaric et al. | 250/487.1 |

FOREIGN PATENT DOCUMENTS

| | | | |
|---|---|---|---|
| 18269 | 10/1979 | Japan | 250/310 |
| 155380 | 9/1983 | Japan | 250/310 |

*Primary Examiner*—Carolyn E. Fields
*Attorney, Agent, or Firm*—Walter Ottesen

[57] ABSTRACT

A detector for back-scattered electrons includes a scintillator crystal and a light-conducting device for directing away the secondary radiation to a receiver. The light-conducting device is placed against the scintillator crystal in such a way that the secondary radiation is directed away symmetrically to two lines of symmetry. The two lines of symmetry are located in the plane of the scintillator crystal and are at right angles to one another. In this way, a uniform illumination of the scanned image is obtained.

22 Claims, 9 Drawing Figures

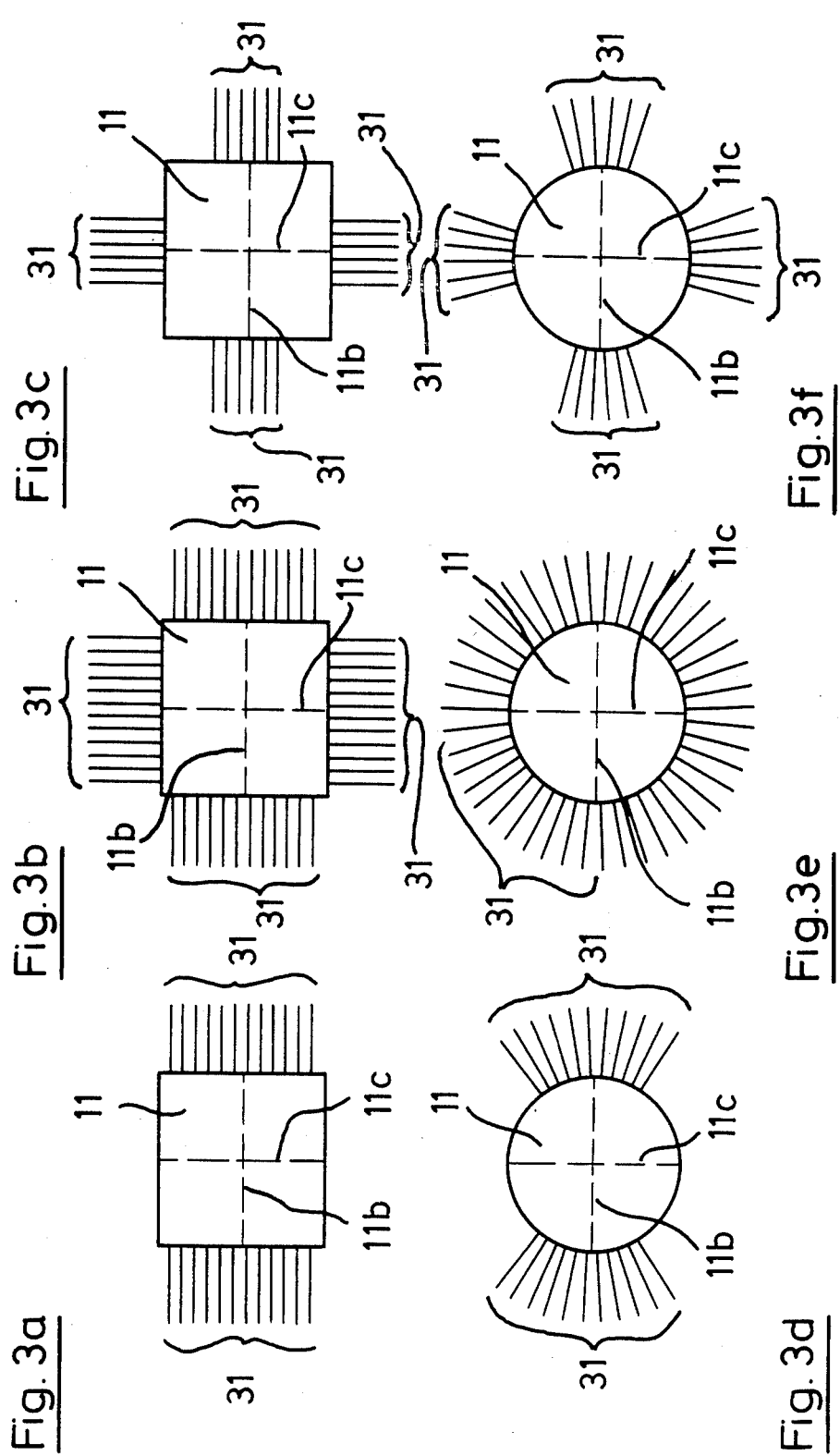

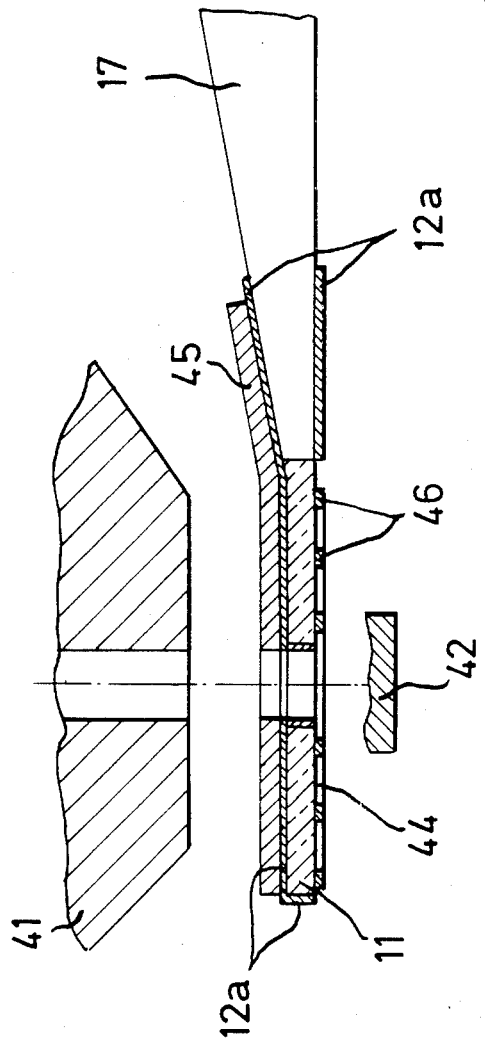

DETECTOR FOR BACK-SCATTERED ELECTRONS

FIELD OF THE INVENTION

The invention relates to a detector for back-scattered electrons having a flat scintillator crystal and a light-conducting device for diverting the secondary radiation to a receiver. Detectors of this type are preferably used in scanning electron microscopes and Transmission electron microscopes with scanning attachment.

BACKGROUND OF THE INVENTION

In a scanning electron microscope, the specimen to be examined is scanned by an electron beam focused onto the specimen. During this operation, various interactions take place in the specimen. The most important of these are low-energy secondary electrons (SE) and electrons of the electron beam scattered at the specimen with little or not energy loss, which are known as back-scattered electrons (BSE). With the aid of suitable detectors and an image formation corresponding to the scanning movement of the electron beam, images are produced, for instance on a monitor, which correspond to the electron emission of the specimen. Since in the case of flat specimens, the back-scattered electron coefficient is a function of the atomic number Z, it is possible, using detectors that respond only to back-scattered electrons, to perform material analyses in micro ranges (so-called material contrast).

European patent application EP-Al No. 0 018 031 discloses a detector system which includes a plurality of detector elements having flexible optical light conductors. At one end of each light conductor, there is an optical funnel with an entrance screen. The other ends of the light conductors are coupled to a transparent block that serves as a wall sealing means. The detector system includes selection means for selecting from signals from at least one of the detector elements. In order to measure the back-scattered electrons, the detector elements must be located between the last electron optical lens and the specimen. With these detector elements, however, this spacing cannot be as close as is required for short focal-length objectives that are needed for high resolution.

From a publication by Autrata et al in Scanning Electron Microscopy 1983/II, page 489, the use of cerium-doped YAP and YAG monocrystals is known. In this article, detectors having wafer-like monocrystals are described, which have a bore in the center for the electron beam and can therefore be accommodated in a narrow space between the last electron optical lens and the specimen. The monocrystals are connected via light-conducting devices to photomultipliers. If the monocrystal is circular in shape, one-half of the circular side wall is cemented to the light-conducting device. If the monocrystal is square, one side face is cemented to the light-conducting device, and an $AL_2O_3$ layer having a thickness of $\lambda/4$ effects a better transfer of photons into the waveguide device. In another embodiment having a circular monocrystal, one circular face rests on the flat part of a unidirectional light-conducting device, which makes it possible to attain a stronger output signal for the detector.

These known detectors having monocrystals have the disadvantage that with homogeneous specimens, the electrons that are scattered back from different points trigger signals of various intensities; especially images at low magnifications, this results in evenly illuminated images. This disadvantage becomes particularly problematic when material analyses are performed.

SUMMARY OF THE INVENTION

It is an object of the invention to provide a detector with which uniform illumination of the entire image surface is obtained even at low magnifications and which is also suitable for high magnifications, and which furthermore has a good signal-to-noise ratio.

In accordance with the invention, this object is attained by configuring and placing the light-conducting device against the scintillator crystal in such a way that the diversion of the secondary radiation from the scintillator crystal is symmetrical to two lines of symmetry of the scintillator crystal, these lines being disposed in the plane of the scintillator crystal and at right angles to one another.

As a light-conducting device, not only can solid parts (such as are described in FIGS. 1 and 2) or optical funnels having light conductors known in the art be used; all fiber-optics devices can also be used. The wafer-like scintillator crystal may be square or circular.

In an advantageous embodiment, the scintillator crystal is square, and the light entering surfaces of the light-conducting device are placed on two mutually adjacent side walls of the square scintillator crystal. This embodiment has the advantage that it is especially flat and is therefore suitable for very short distances between the specimen and the last electron optical lens.

In a particularly advantageous embodiment, the light-conducting device includes two deflecting prisms, two light-conducting rods and one cylindrically-shaped light conductor.

In another advantageous embodiment, the light-conducting device is placed on one face of the scintillator crystal wafer. The light-conducting device in this case includes a plate-shaped part, which has two reflecting mirror surfaces on its side walls which reflect the secondary radiation into light-conducting rods which, in turn, are connected to a cylindrically-shaped light conductor.

As the scintillator crystal, YAP: $Ce^{3+}$ is preferably provided. This monocrystal has a good quantum yield and hence a good signal-to-noise ratio. Its short decay time, in the vicinity of 70 ns, enables image formation with a video bandwidth of 7 MHz.

The embodiment according to the invention of the light-conducting device and its coupling to the scintillator crystal makes it possible to configure the scintillator crystal with a thickness of only 1 mm. As a result, short working distances between the last electron optical lens and the specimen, and hence high resolution, are possible without substantially restricting manipulation of the specimen. The detector is furthermore suitable for ultra-high vacuum use.

BRIEF DESCRIPTION OF THE DRAWING

The invention will now be described with reference to the drawing wherein:

FIGS. 3a to 3f show examples of the symmetrical pickup of the secondary radiation; and, FIG. 4 shows details of an embodiment of a detector according to the invention.

DESCRIPTION OF THE PREFERRED EMBODIMENTS OF THE INVENTION

Figure 1:
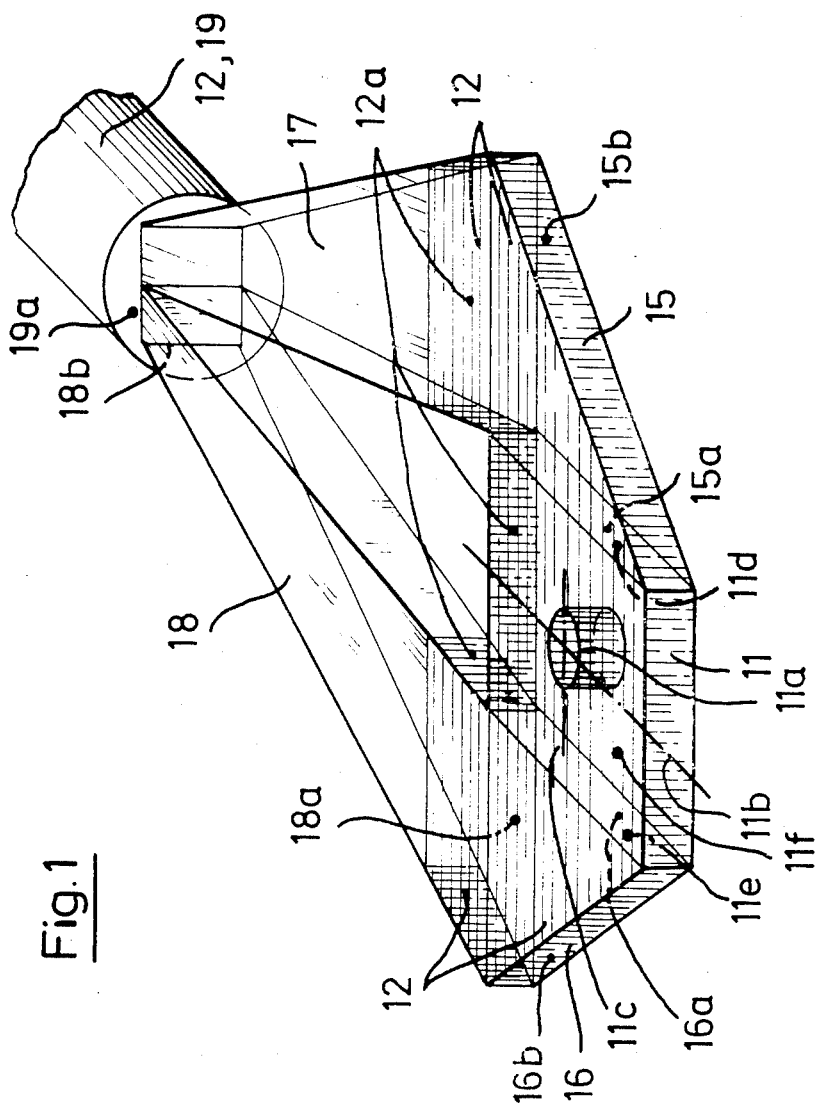
FIG. 1 is a perspective view of a detector with pickup of the secondary radiation from the scintillator crystal on two sides thereof.

In FIG. 1, reference numeral 11 indicates a wafer-like scintillator crystal having a bore 11a in the middle thereof for the electron beam (not shown) which impinges upon the specimen (not shown) below the detector. The scintillator crystal 11 is square in shape and therefore has two lines of symmetry 11b and 11c at right angles to one another in the plane 11f. The light-conducting device 12 is placed against the side faces 11d and 11e of the scintillator crystal 11 in such a way that its light entering faces 15a and 16a are symmetrical to the lines of symmetry 11b and 11c. In this way, a uniform illumination is attained over the entire image field of the scanned specimen. The secondary radiation of the scintillator crystal entering the light entering faces 15a and 16a is reflected at the reflecting surfaces 15b and 16b of the deflecting prisms 15 and 16, respectively, and is conducted into the respective light-conducting rods 17 and 18. These light-conducting rods increase in thickness from the slight thickness 18a of the deflecting prisms 15, 16 and of the scintillator crystal 11 to a considerably greater thickness 18b at the other end, while decreasing in width in this direction. They are placed against the front face 19a of the cylindrically-shaped light conductor 19. The cylindrically-shaped light conductor 19 is extended in a vacuum-tight manner out of the microscope column in a manner known per se and is connected outside of this column to a receiver, for instance a multiplier.

In an advantageous embodiment, YAP: $Ce^{3+}$ is used as the scintillator crystal. This crystal has a very long lifetime, so that it can be cemented to the light-conducting device 12, and all the parts of the light-conducting device can be cemented to one another as well. The good quantum yield of this YAP crystal makes it possible for it to have a thickness of only 1 mm, so that the detector occupies only a small amount of space between the last electron optical lens and the specimen.

The scintillator crystal 11 is provided with a reflective coating 12a on its exposed surfaces except for the one surface facing toward the specimen; the reflective coating 12a also covers the front portion of the light-conducting device 12. However, the remaining portion of the light-conducting device has a free surface as shown in FIG. 1. The light-conducting device is preferably made of glass. The loss-free total reflection is utilized where the light-conducting device has a free surface.

Figure 2:
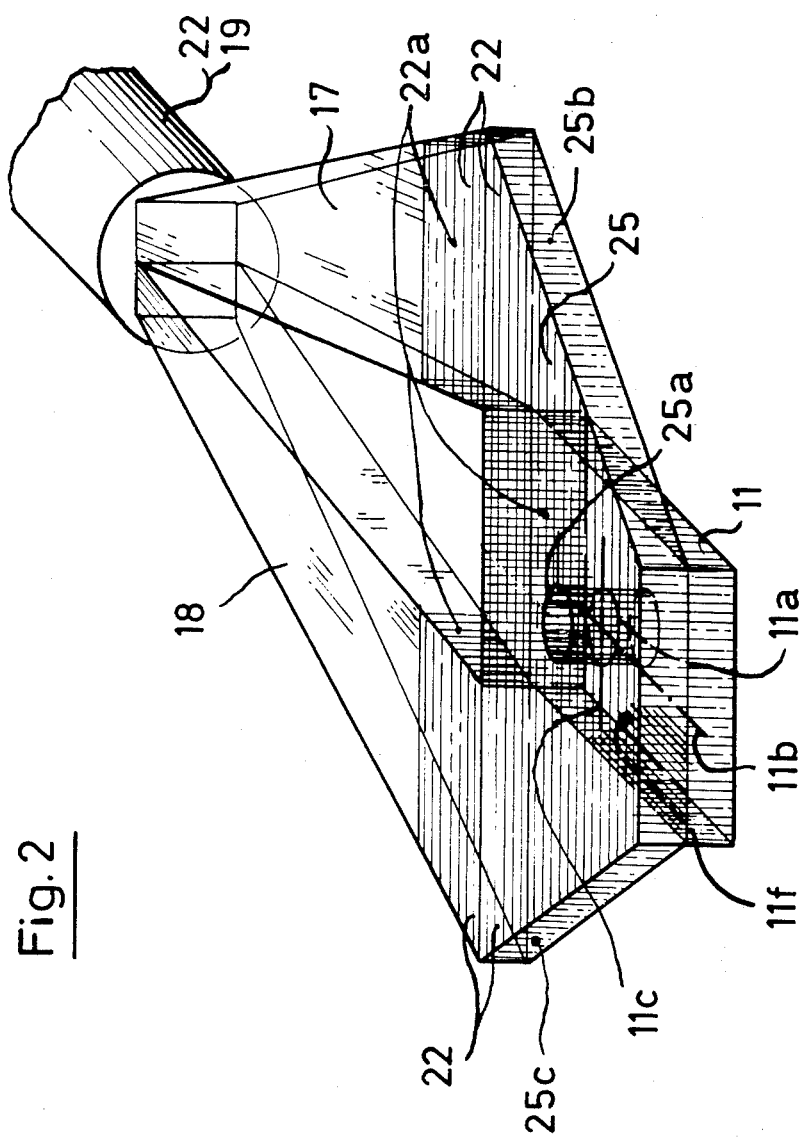
FIG. 2 is a perspective view of a detector with pickup of the secondary radiation from the scintillator crystal at one surface thereof.

FIG. 2 shows another embodiment of the detector with pickup of the secondary radiation of the scintillator crystal from one surface. Reference numeral 11 again indicates the scintillator crystal, and 11a indicates the bore for the electron beam. With its surface 11f, the scintillator crystal 11 is cemented to the plate-shaped part 25 of the light-conducting device 22 which likewise has a bore 25a. The bore 25a is disposed above the bore 11a. The plate-shaped part 25 is configured such that the secondary radiation is again directed away symmetrically to the axes of symmetry 11b and 11c of the scintillator crystal 11. The plate-shaped part 25 has two reflecting side surfaces 25b and 25c, by means of which the secondary radiation is conducted into the light-conducting rods 17 and 18. The rods 17 and 18 are configured as described in conjunction with FIG. 1 and are joined to the cylindrically-shaped light conductor 19. The exposed surfaces of the scintillator crystal 11, with the exception of the side facing the specimen, and the surfaces at the front end portion of the light-conducting device 22 are likewise provided with a reflective coating 22a.

In an advantageous embodiment, YAP: $Ce^{3+}$ is again used as the scintillator crystal, and all the parts are firmly cemented to one another.

In FIGS. 3a to 3f, exemplary embodiments are shown of how the secondary radiation can be directed away symmetrically with respect to the two lines of symmetry 11b and 11c. FIG. 3a illustrates the two-sided pickup, described in detail in conjunction with FIG. 1, from a square scintillator crystal 11. Reference numeral. 31 indicates optical fibers which can also be used, in a known manner, to carry away the secondary radiation. FIGS. 3b and 3c illustrates a four-sided pickup; in the case of FIG. 3c, only the middle portions of the side faces are utilized.

FIGS. 3d to 3f show corresponding arrangements for a circularly-shaped scintillator crystal; because of the circular boundary, there are any number of pairs of lines of symmetry at right angles to one another; that is, the orientation of the scintillator crystal to the light-conducting device is arbitrary.

In FIG. 4, further details are shown, taking as an example the detector described in conjunction with FIG. 1. FIG. 4 is a sectional view taken along the line of symmetry 11b shown in FIG. 1.

In FIG. 4, the pole piece of the last electron optical lens is shown at 41 and the specimen is shown at 42. The reflective coatings already discussed are shown at 12a. A layer 44 of aluminum 50 nm thick is applied to the side of the scintillator crystal facing the specimen. This thin layer is still penetrated by the back-scattered electrons, and because of its electrical conductivity it reliably prevents the formation of a charge.

In an advantageous embodiment, there is also a wire grid located ahead of the aluminum layer 44; if the distance between the specimen 42 and the detector is too short, the wire grid effects a conductive connection via the specimen holder and thereby closes a current circuit, which triggers a warning signal if the specimen is moved too close to the detector.

In a further advantageous embodiment, a metal plate 45 is cemented to the front portion of the detector on the side thereof facing away from the specimen, thereby imparting additional mechnical strength to the detector. The metal plate 45 can also protrude outwardly beyond the detector and be equipped with a releasable connection for connecting the detector and the pole piece 41. By this means, the detector, which otherwise is extended through the wall of the microscope column in a known manner only via the light-conducting rods 17 and the cylindrically-shaped conductor 19 (FIG. 1) and held there, can be held in position in a much stabler manner between the pole piece 41 of the last electron optical lens and the specimen 42.

The same detector configuration can also be equipped with a suitable material for cathode luminescence, instead of with the scintillator crystal. In that case, the light generated in the specimen by the electron beam is detected by a special glass plate. This glass plate, made of K5, for example, is provided on the side facing toward the specimen with an electrically conductive yet optically transparent layer; on all of its other exposed surfaces it is metal-coated so as to be optically opaque.

It is further understood that the foregoing description is that of the preferred embodiments of the invention and that various changes and modifications may be made thereto without departing from the spirit and scope of the invention as defined in the appended claims.

What is claimed is:

1. A detector for detecting back-scattered electrons and directing secondary radiation to a receiver, comprising:
    a wafer-like scintillator defining a plane and two symmetry lines disposed in said plane at right angles to each other;
    a light-conducting device for directing the secondary radiation away from said scintillator and to the receiver, said light-conducting device being placed on said scintillator and being configured so as to cause the secondary radiation to be directed away from the scintillator symmetrically to said two symmetry lines;
    said scintillator being square defining two edge walls lying directly opposite each other; and,
    said light-conducting device having two light-entering surfaces placed against corresponding ones of said edge walls.

2. The detector of claim 1, said light-conducting device including two deflecting prisms placed against corresponding ones of said edge walls, a cylindrically-shaped light conductor and two light-conducting rods connecting corresponding ones of said prisms to said cylindrically-shaped light conductor.

3. The detector of claim 2, comprising a reflecting coating disposed on said deflecting prisms and on the portion of said rods directly adjacent said prisms.

4. The detector of claim 1, said scintillator being a scintillator crystal YAP: $Ce^{3+}$.

5. The detector of claim 1, said scintillator having a surface facing toward a specimen, said detector further comprising: an aluminum layer formed on said surface having a thickness of 50 nm; and, reflecting coatings formed on all other exposed surfaces of said scintillator.

6. The detector of claim 1, said scintillator having a surface facing away from a specimen, the detector further comprising a reinforcement piece of sheet metal disposed on said surface of said scintillator.

7. The detector of claim 2, said scintillator having a surface facing toward a specimen, the detector further comprising a wire grid mounted on said surface.

8. The detector of claim 7, wherein the specimen is held in a holder, and said detector further comprising warning signal means for issuing a warning signal in response to a movement of said specimen holder too close to said wire grid.

9. A detector for detecting back-scattered electrons and directing secondary radiation to a receiver, comprising:
    a wafer-like scintillator defining a plane and two symmetry lines disposed in said plane at right angles to each other;
    a light-conducting device for directing the secondary radiation away from said scintillator and to the receiver, said light-conducting device being placed on said scintillator and being configured so as to cause the secondary radiation to be directed away from the scintillator symmetrically to said two symmetry lines;
    said scintillator having a flat planar surface and said light-conducting device being placed upon said planar surface; and,
    said light-conducting device including a plate-like part having reflecting edge surfaces, a cylindrically-shaped light conductor and two light-conducting rods connecting corresponding ones of said edge surfaces to said cylindrically-shaped light conductor.

10. The detector of claim 9, comprising a reflecting coating disposed on said plate-like part and on the portion of said rods directly adjacent said plate-like part.

11. The detector of claim 9, said scintillator being a scintillator crystal YAP: $Ce^{3+}$.

12. The detector of claim 9, said scintillator having a surface facing toward a specimen, said detector further comprising: an aluminum layer formed on said surface having a thickness of 50 nm; and, reflecting coatings formed on all other exposed surfaces of said scintillator.

13. The detector of claim 9, said scintillator having a surface facing away from a specimen, the detector further comprising a reinforcement piece of sheet metal disposed on said surface of said scintillator.

14. The detector of claim 9, said scintillator having a surface facing toward a specimen, the detector futher comprising a wire grid mounted on said surface.

15. The detector of claim 14, wherein the specimen is held in a holder, and said detector further comprising warning signal means for issuing a warning signal in response to a movement of said speciment holder too close to said wire grid.

16. A detector for detecting back-scattered electrons and for directing secondary radiation to a receiver, the detector comprising:
    a plate-like scintillator defining a plane and two symmetry lines disposed in said plane and at right angles to each other;
    a light-conducting device for directing the secondary radiation away from said scintillator to said receiver in such a manner that the secondary radiation is conducted at least approximately in said plane; and,
    said light-conducting device including at least two solid light-conducting parts configured and juxtaposed to said scintillator so as to cause said secondary radiation to be conducted away from said scintillator symmetrically to said symmetry lines.

17. The detector of claim 16, said scintillator being a quadratic scintillator crystal having mutually opposite side walls, said two light-conducting parts being in abutting engagement with corresponding ones of said side walls.

18. The detector of claim 17, said light-conducting parts being two deflecting prisms placed against corresponding ones of said side walls, a cylindrically-shaped light conductor and two light-conducting rods connecting corresponding ones of said prisms to said cylindrically-shaped light conductor.

19. The detector of claim 16, said scintillator having a flat planar surface, said light-conducting device being placed on said planar surface.

20. The detector of claim 19, said light-conducting device including a plate-like part having reflecting edge surfaces, a cylindrically-shaped light conductor and two light-conducting rods connecting corresponding ones of said edge surfaces to said cylindrically-shaped light conductor.

21. The detector of claim 16, said scintillator being a scintillator crystal YAP: $Ce^{3+}$.

22. The detector of claim 16, said plate-like scintillator having mutually opposite side walls facing away from each other and being formed so as to be symmetrical with respect to said symmetry lines; and, said two light-conducting parts having respective light-entry faces in contact engagement with corresponding ones of said side walls so as to also be symmetrical with respect to said symmetry lines.

* * * * *

UNITED STATES PATENT AND TRADEMARK OFFICE
CERTIFICATE OF CORRECTION

PATENT NO. : 4,700,075

DATED : October 13, 1987

INVENTOR(S) : Dieter Kurz and Norbert Schäfer

It is certified that error appears in the above-identified patent and that said Letters Patent is hereby corrected as shown below:

In column 1, line 67: delete "images".

In column 1, line 68: delete "evenly" and substitute -- unevenly -- therefor.

In column 4, line 18: delete "illustrates" and substitute -- illustrate -- therefor.

In column 4, line 41: after "grid", please add -- 46 --.

In column 5, line 23: after "being", please add -- a --.

In column 6, line 31: delete "speciment" and substitute -- specimen -- therefor.

Signed and Sealed this

Twelfth Day of April, 1988

Attest:

DONALD J. QUIGG

*Attesting Officer*      *Commissioner of Patents and Trademarks*